United States Patent [19]

Berndlmaier et al.

[11] 4,323,914
[45] Apr. 6, 1982

[54] HEAT TRANSFER STRUCTURE FOR INTEGRATED CIRCUIT PACKAGE

[75] Inventors: Erich Berndlmaier, Wappingers Falls; Bernard T. Clark, Poughquag; Jack A. Dorler, Wappingers Falls, all of N.Y.

[73] Assignee: International Business Machines Corporation, Armonk, N.Y.

[21] Appl. No.: 8,375

[22] Filed: Feb. 1, 1979

[51] Int. Cl.³ .................................................. H01L 25/04
[52] U.S. Cl. ......................................... 357/82; 357/70; 357/69; 357/72
[58] Field of Search .................... 357/82, 69, 70, 72

[56] References Cited

U.S. PATENT DOCUMENTS 4,092,697  5/1978  Spaight ................................. 357/82

OTHER PUBLICATIONS

IBM Tech. Bul., vol. 20, No. 11B, Apr. 1978, p. 4820, Arnold et al.
IBM Tech. Bul., vol. 19, No. 4, Sep. 1976, p. 1348, Jeannotte.
IBM Tech. Bul., vol. 19, No. 4, Sep. 1976, p. 1260.

*Primary Examiner*—Edward J. Wojciechowicz
*Attorney, Agent, or Firm*—Wesley DeBruin

[57] ABSTRACT

Heat is removed from a Large Scale Integrated Circuit semiconductor package via a thermal conductive path including a thermally conductive liquid. The integrated circuit chips are flip chip bonded to a substrate having a printed circuit and raised contact pads serving to interconnect contact areas on the chip. A metal, ceramic (or combination thereof) cover engages the perimeter of the substrate and encloses the chips (or chip). The thermal liquid is contained within the cavity define by the cover and substrate. The chips (or chip) and the flip chip connections are protected from contamination and the deleterious effects of the thermally conductive liquid by a parylene film enveloping same. Additionally, back side bonded (beam lead) integrated circuit chips will have an enhanced heat transfer path by incorporating liquid metal and a protective coating of parylene.

3 Claims, 11 Drawing Figures

HEAT TRANSFER STRUCTURE FOR INTEGRATED CIRCUIT PACKAGE

FIELD OF THE INVENTION

The invention relates generally to heat transfer structures and materials for integrated circuit packaging structures. More particularly, to flip chip, back bonded, or beam lead, integrated chip packaging structures wherein an inert film protects the chip and chip connection from contamination and the corrosive and detrimental effects of the thermally conductive liquid utilized therein.

BACKGROUND AND PRIOR ART

The efficient extraction of heat from integrated circuit flip packages presents a very significant limitation on the design of Large Scale Integrated (LSI) circuits. Without an efficient heat transfer mechanism, the speed and power capabilities of the circuitry of an integrated circuit package are severely limited. Early semiconductor devices solved the problem of making one of the electrodes of the device both a thermal and electrical direct contact to the external world and thereby connecting the electrode to an efficient heat transfer device, such as a studded heat sink. This was especially convenient when the electrode could be maintained at ground potential, for example. Representative discrete semiconductor device structures of this type are disclosed in U.S. Pat. Nos. 3,719,862 and 3,836,825. This approach was also used in some of the early approaches to the removal of heat from integrated circuit packages. For example, in an article entitled "Conduction Cooled Heat Plate for Modular Circuit Package" by R. J. Dombrowskas et al., IBM Technical Disclosure Bulletin, Volume 13, No. 2, July 1970, page 442, there is disclosed a cooling technique using a conduction cooled isothermal heat plate which is metallurgically connected via a molybdenum slug to the various circuit chips in an integrated circuit package. With this technique the chip is fixed at the potential of the heat plate.

An additional difficulty encountered when the slug or stud is directly connected or physically attached to the chip, is that various "Z" stresses occur during the routine heat cycling the chip experiences. These stresses result in fatigue in the flip-chip connections and semiconductor chip frequently resulting in failure of the device.

There are many instances when the integrated circuit chip cannot be maintained at ground potential or at the potential of a heat sink. This presents a significant problem since most good heat transfer mechanisms are also good electrical conductors. Many integrated circuit package designs include the integrated circuit with discrete bond points (such as flip-chip connections) to a suitable substrate, enclosed by a cover in a sealed atmosphere of an inert gas. In these packages, the only thermal paths are the convection through the inert gas to the cover and conduction through the discrete bond points to the substrate. Such a design often experiences very significant thermal resistance which severely limits the power dissipation of the package. These restrictions are at least as serious, if not more serious, for devices that are flip-chip joined (or bonded) to the substrate through a pattern of solder bumps (or balls) on the active side of the chip. [Reference is made to U.S. Pat. No. 3,429,040, entitled "Method of Joining A Component to A Substrate", granted Feb. 25, 1969 to L. F. Miller, and U.S. Pat. No. 3,517,278, entitled "Flip Chip Structure" granted June 23, 1970 to R. W. Hager]. Here the conduction areas provided by the bumps are quite small and usually inadequate for heat dissipation of the higher power devices. While it is possible to enhance the heat transfer from a flip chip structure, such as by a metallurgical joining of the backside of the chip to the cover, this frequently results in additional stresses on the device and serious reliability problems. Furthermore, as device costs increase due to their complexity and circuit density, it is desirable to be able to repair defective devices. This is not readily accomplished when there is a metallurgical joining of the chip backside to the cover.

The above described problems tend to be even more acute when dealing with multi-chip modules, where many chips are bonded to a single substrate. A common requirement of such modules is that different chips are biased at different electrical potentials, so they cannot be commoned to a single point. Since such modules usually have a much larger substrate than single chip modules, the reliability problem resulting from different thermal expansion characteristics are even more pronounced. As the distance of a chip from the neutral point of the substrate increases, the thermal stresses experienced resulting from the metallurgical bonding of the chip to the cover increase.

Multichip modules are usually much more expensive than single chip modules. Accordingly, it becomes even more desirable to be able to remove the cover of the module and repair or replace any defective component.

Numerous techniques, structures and approaches to the cooling of integrated circuit chips are known to the art.

A representative number of which are identified and briefly discussed below.

1. "Microcircuit Heat Sink" by G. B. Cherniak et al., IBM Technical Disclosure Bulletin, Vol. 8, No. 10, March 1966, page 1457. The Cherniak et al publication discloses a flip-chip structure wherein a copper pin and thermally conductive grease (such as silicon grease) conducts heat from the chip to the substrate.

2. "Chip Heat Sink Package Assembly" by A. H. Johnson et al., IBM Technical Disclosure Bulletin, Vol. 12, No. 10, March 1970, page 1665. The Johnson et al publication discloses a flip-chip structure wherein the chip is back bonded by a gold eutectic bond to a finned molybdenum metal heat sink.

3. "External Module Heat Sink Fastened to Board" by P. J. Cunavelis et al., IBM Technical Disclosure Bulletin, Vol. 14, No. 1, June 1971, page 182. In the Cunavelis et al publication a thermal conductive paste is utilized to reduce the contact thermal resistance between a heat sink and a module.

4. "Controlling Pressure Changes in A Liquid Encapsulated Module" by N. G. Aakalu et al., IBM Technical Disclosure Bulletin Vol. 14, No. 8, January 1972, page 2533. The Aakalu et al publication discloses an encapsulated module comprising an enclosed container, having one wall thereof formed by a substrate carrying chips. The container is substantially filled with a liquid coolant which is in contact with the chips to remove heat therefrom by nucleate boiling.

5. "Conduction cooled Chip Module" by R. J. Dombrowskas et al., IBM Technical Disclosure Bulletin, Vol. 14, No. 9, February 1972, page 2689. The Dombrowskas et al publication discloses a flip-chip structure wherein a heat conductive intermediate viscosity dispersion material is utilized between the back surface of the chip and the heat sink.

6. "Chip Cooling" by W. A. Campo et al., IBM Technical Disclosure Bulletin, Vol. 17, No. 2, July 1974, page 392. The Campo et al publication discloses the use of a bimetallic foil attached to the module cover and extending to the back side of the chip. To ensure a good thermal contact between the foil and the chip, a layer of high-thermal conductivity dielectric gel may be employed.

7. "Modular Heat Sink" by H. Parsapour, IBM Technical Disclosure Bulletin, Vol. 17, No. 11, April 1975, page 3313. The Parsapour publication discloses the employment of a heat pipe in the form of a bellows tube which is flexible in the longitudinal direction. The heat pipe extends from the substrate of a module containing a flip-chip structure to a heat sink.

8. "Thermally enhanced Multilayer Ceramic Substrate Structure" by Q. P. Kerjilian et al., IBM Technical Disclosure Bulletin, Vol. 18, No. 2, July 1975, pages 353–4. The Kerjilian publication discloses a multilayer ceramic chip carrier which provides a plurality of internal power and signal planes within the substrate. The substrate is designed to accommodate high density large scale integration chips and have room on the perimeter thereof for mounting a heat sink. The ceramic heat sink is an integral portion of the multilayer ceramic package.

9. "Full Semiconductor Wafer Package" by R. A. A. Watson, IBM Technical Disclosure Bulletin, Vol. 18, No. 3, August 1975, page 642. The Watson publication discloses the use of a thin film of thermally conductive oil between a semiconductor wafer surface and a heat sink cover.

10. "Cooling Cup for Powder or Liquid Filled Modules" by S. P. Antippas, IBM Technical Disclosure Bulletin, Vol. 18, No. 5, October 1975, pages 1387–88. The Antippas publication discloses a flip chip structure wherein between the backside of the chip and the cover a thermally conductive powder such as alumina or beryllia are employed to reduce the thermal resistance from the backside of the chip to the cover.

11. "Cooling and Minimizing Temperature Radiant in Stacked Modules" by R. D. Audi, IBM Technical Disclosure Bulletin, Vol. 19, No. 2, 1976, page 414. In the Audi publication a flip chip structure is shown wherein a conductive elastomer is positioned between the backside of the upper substrate and the inner surface of the cap.

12. "Circuit Module with Gallium Metal Cooling Structure" by D. A. Jeannotte, IBM Technical Disclosure Bulletin, Vol. 19, No. 4, September 1976, page 1348. The text of the Jeannotte publication reads essentially as follows: "The drawing shows a section view of a circuit module having a conventional substrate, a semiconductor chip connected to RAM (not shown) on the substrate by means of solder pads and having pins for electrical connections to other components. This structure has a cap that is made up of a peripheral flange and a cover that has pins and forms a heat sink.

The chip, the other electrical components on the substrate, and the flange are covered with a thin dielectric layer. Gallium metal is located in the space between the dielectric layer and the heat sink. Gallium melts at the normal operating temperature of the module and it forms a good heat transfer path from the chip to the heat sink. The heat sink is shaped to have release spaces for expansion of the gallium. A pin extends through the dielectric layer to make electrical contact with the gallium for maintaining the gallium at ground potential.

13. "Semiconductor Module with Improved Air Cooling", by O. J. Cain et al., IBM Technical Disclosure Bulletin, Vol. 19, No. 5, October 1976, page 1802. The Cain et al publication discloses a flip chip structure wherein silver foil is attached to the inside surface of the cap by a solder film. The backside of the chip is given a metal layer to which the other ends of the silver foil is bonded.

14. "Heat Dissipation Using Thermally Conductive Putty", by E. W. Neumann, IBM Technical Disclosure Bulletin, Vol. 19, No. 5, October 1976, page 1799. The Neumann publication discloses the use of a thermally conductive filled silicon polymer in the form of a putty which can be used to aid in heat dissipation from a circuit card on which irregularly shaped heat generating components are mounted.

15. "Inner-Fin Air-Cooled Module" by O. R. Gupta, IBM Technical Disclosure Bulletin, Vol. 19, No. 5, October 1976, page 1804. The Gupta publication shows a flip chip structure wherein a suitable high heat conducting fluid such as helium is employed in the cavity defined by the substrate and the cover of the module. The backside of the chip has attached thereto a large fin which is arranged to have a sizeable surface closely spaced to an adjacent inner surface of the cap.

16. "Thermal Enhancement of Modules" by E. B. Hultmark et al., IBM Technical Disclosure Bulletin, Vol. 19, No. 8, January 1977, page 3127. The Hultmark et al publication discloses a module having a cover encompassing a substrate containing, as shown, three flip chip structures. With in the module is a tear resistant sack containing a liquid metal. The liquid containing flexible sealed sack is in physical contact with at least a portion of the module cover and the backside of each of the chips of the three flip chips structures. The publication reads essentially as follows: "A liquid metal filled sack can be placed over chips on a module to provide a pliable, thermally conductive, but electrically isolated, heat sink, which can easily be disassembled for repair. A thin but reliably tear resistant membrane like sack 10 contains a metal which is liquid at or near room temperature. Gallium is a most likely choice for the metal while the sack can be made of one of many plastics such as polyolefins and silicon."

17. U.S. Pat. No. 4,069,498 entitled "Studded Heat Exchanger For Integrated Circuit Package", granted Jan. 17, 1978 to K. C. Joshi and of common assignee herewith. The Abstract of the Joshi patent reads as follows: "Heat is removed from the silicon device in an integrated circuit package by means of a stud which is slidably mounted in a cap enclosing the integrated circuit device. A low melt solder is used to join the stud to the cap and the same solder is also deposited on the stud tip, which will subsequently contact the integrated circuit device in the package. After the integrated circuit, substrate and cap are assembled and sealed, the assembly is heated to melt the low melt solder so that the stud slides down and makes contact with the integrated circuit device.

18. U.S. Pat. No. 4,092,697 entitled "Heat Transfer Mechanism for Integrated Circuit Package" granted May 30, 1978 to Ronald Neal Spaight and of common assignee here with. The Abstract of the Spaight patent reads as follows: "Heat is removed from silicon devices in an integrated circuit package by means of a thermal liquid material contained in a film mounted on the under side of a cover imposing the integrated circuit device. The film is electrically non-conductive and the film with the enclosed thermal liquid material form a formable pillow such that after the chip/substrate are assembled, the cover with the film containing the thermal liquid material is placed over the substrate and sealed thereto in a manner such that the film comes into direct contact with the top of the chip mounted on the substrate. This provides a direct heat transfer from the chip to the film to the thermal liquid material out to the cover, which may be formed as a heat radiator."

19. "Chip Suitable for Backside Cooling" by E. Berndlmaier et al., IBM Technical Disclosure Bulletin, Vol. 19, No. 11, April 1977, page 4190. This publication discloses the use of an indium dot to improve the heat transfer path from the backside of a chip to the cap of the module. The publication shows a flip chip structure wherein a backside P/N junction is provided in the electrical path from the substrate through the solder ball connected chip, indium dot and cover.

20. "Internal Thermal Design of LSI Package", by R. C. Chu, IBM Technical Disclosure Bulletin, Vol. 19, No. 12, May 1977, page 4690. The Chu publication discloses a flip chip structure wherein a metal foil is laid directly over the backside of the chip and in good contact therewith. The foil is long enough to attach to the substrate and provide a parallel thermal path to the substrate and thereby improve heat dissipation. The metal foil for example is a soft metal such as aluminum and indium.

21. "Conduction Path for Electronic Components" by R. C. Chu, IBM Technical Disclosure Bulletin, Vol. 19, No. 11, April 1977, page 4279. The Chu publication discloses a flip chip structure wherein an inner can or inner cover physically contains thermal compounds around the chip. The inner can or cover has openings which allow excessive compound flow out so that thermally induced compression is precluded. When thermal expansion occurs the openings in the inner can provide room for expansion and the thermal component flows out. When the temperature is reduced the thermal compound contracts and through surface tension the compound is again drawn into the inner can. At all times the thermal compound fills the gap between the backside of the chip and the inner can. The inner can may be attached to the outer cover of the module.

22. Reference is made to U.S. Pat. No. 4,034,468 entitled "Method for Making Conduction Cooled Circuit Package" granted July 12, 1977 to N. G. Koopman;

U.S. Pat. No. 4,034,469 entitled "Method of Making Conduction Cooled Circuit Package" granted July 12, 1977 to N. G. Koopman et al; and U.S. Pat. No. 4,081,825 entitled "Conduction Cooled Circuit Package" granted March 28, 1978 to N. G. Koopman et al.

The aforerecited patents are each of common assignee with the subject application and are directed to a conduction cooled circuit package employing a flip chip structure and method of fabricating same. Further, each of the aforerecited patents disclose the use of a low melting point solder such as indium or an alloy thereof. The abstract of U.S. Pat. No. 4,034,468 reads as follows: "A method for making a circuit package which exhibits an excellent heat transfer path from a semiconductor chip or other heat generating device to the heat sink can or cover of a package. A heat conducting pad is placed in proximate relationship to either the heat sink or to a surface of the chip and is metallurgically bonded to the other. In one of the preferred embodiments, a low melting point solder, such as indium or an alloy thereof, is metallurgically bonded to the inside of the heat sink cover in a limited central region thereof. The solder is then positioned adjacent the chip and reflowed to substantially fill in the gap between the solder and the chip, but with no stress between the chip and the solder. The assembly exhibits excellent heat transfer from the chip to the cover and any associated heat dissipating structures. The preferred method involves the flow of a mass of solder against the back side of the chip, which has previously been solder-bonded on the front side to conductors on the surface of an alumina substrate."

23. "LSI Cooling Technique" by M. Cases et al., IBM Technical Disclosure Bulletin, Vol. 20, No. 12, May 1978, page, 51–59. This publication discloses a flip-chip structure wherein mercury is employed between the back side of the chip and the module cover to improve the conductive heat path. Also, to protect the chip solder joints and wiring from contamination a guard ring is constructed around the chip. Within the guard ring and encompassing the chip solder joints a non-conducting jelly such as silicon gel, is employed. It is further suggested in the publication that to facilitate the adhesion of the mercury dot a coating such as silver is applied to both the back of the chip and the inner surface of the module cap.

24. Reference made to U.S. Pat. No. 3,673,306 entitled "Fluid Heat Transfer Method and Apparatus for Semiconducting Devices" granted June 27, 1972 to M. E. Kirkpatrick. The Kirkpatrick patent discloses the use of a heat pipe type thermal conductive path within a metallic housing such as a transistor can for highly efficient cooling of high powered semiconductor devices which normally require large heat dissipation.

25. "Conduction Cooling of Semiconductor Devices" by E. B. Hultmark et al., IBM Technical Disclosure Bulletin, Vol. 20, No. 11B, April 1978, page 4819. In this cooling struction a semiconductor device is flip chip bonded to a substrate which includes I/O pin suitably secured to the bottom surface of the substrate. A cap affixed to the top side of the substrate encloses the device therein. A first stationary wedge is mounted on the underside of the cap over the device. A movable second wedge is mounted in contact with the device 10 and has a camming surface in mating contact with the first wedge. The movable wedge is spring biased into contact with the device and the first wedge to thereby form a bridge of solid thermally conductive material from the device to the cap.

26. "Preventing Hot-Spot Deposits in Liquid Cooled Semiconductor Device Packages" by L. V. Gregor et al., Vol. 19, No. 4, September 1976, page 1260. The Gregor et al publication reads as follows: "In semiconductor packages employing a liquid coolant, the devices generate significant amounts of heat during operation. When the devices are solder bonded to the substrate, the devices are spaced from the substrate. Since the devices are on the bottom side adjacent the substrate, the major portion of the heat generated occurs at this region. The generated heat causes a localized boiling which in use causes the deposition of any contaminants within the liquid to occur. Contamination presents corrosion and reliability problems. In this technique, waxes having very limited solubility in the coolant, typically fluorocarbon liquids are flowed underneath the device to prevent coolant from contacting the device areas. Wax will readily flow underneath the chip and cover the designated areas without withdrawing. Because of the low modulus of these systems, the solder structure reliability will not be affected. Solubility in specific hydrocarbon solvents will allow the easy removal of these waxes for rework of the devices should this be necessary.

Waxes suitable for the purpose include paraffin wax, microcrystalline wax, and other commercially available waxes. In addition to the prevention of hot-spot deposits, the waxes will prevent corrosion from taking place, due to the complete coverage of the solder joints. The amount dispensed usually is of the order of 0.001 gram which readily covers the area underneath the chip without void formations."

Reference is made to U.S. Patent Application Ser. No. 947,788, entitled "Semiconductor Package with Improved Conduction Cooling Structure", filed Oct. 2, 1978 by D. Balderes et al., and of common assignee herewith. The abstract of the Balderes patent application reads as follows: "A Semiconductor device package having a substrate, one or more semiconductor devices mounted on the top surface of the substrate, a heat sink having a surface in opposed spaced parallel relation to the top surface of the substrate, and at least one deformable heat transfer member positioned between a device mounted on the top surface of the substrate, and the surface of the heat sink. The heat transfer member is comprised of a porous block of material, and a heat conductive non-volatile liquid retained within the block of the material by surface tension. The heat transfer member being operative to transfer heat from the device to the heat sink."

"Liquid Cooling of a Multichip Module Package", by D. Balderes et al., Vol. 20, No. 11A, April 1978, pages 4336-7. The Balderes et al publication reads essentially as follows: "When a plurality of integrated circuit chips are mounted on a standard substrate to produce a multichip integrated circuit package, it is also desirable to cool each of the chip members individually through the back side of the chip by the application of some type of cooling member. However, since in an array of chips, not all of the chips are exactly at the same level, the cooling member has to make a flexible or deformable thermal contact with the back side of the chip. The present structure provides the means for uniform flexible thermal contacts with a plurality of chips arranged in an array. The cooling member comprises a plurality of cooling units, each arranged to correspond to a chip to be cooled. The cooling member comprises a cooling liquid, which may conveniently be a liquid, such as a metal, which preferably does not wet the back side of the chip to be contacted. The liquid is retained in the confines of a columnar housing which is connected to a plate member which may conveniently contain a reservoir of the cooling liquid.

Within each unit, the liquid will form a drop which will be self-contained when the cooling unit is not in contact with the chip. When the array of cooling units is brought into respective contact with their corresponding chips, each of the drops will have sufficient flexibility to assume a shape sufficient to assure complete thermal contact with the back side of its respective chip. Because of this flexibility, uniform thermal contact with all of the chips in the array is assured.

"Electronic Packaging Structure" by A. J. Arnold et al., IBM Technical Disclosure Bulletin, Vol. 20, No. 11B, April 1978, pages 4820-2. The electronic packaging structure disclosed in the Arnold et al publication bears a general structural relationship to one embodiment of the invention. However, the invention disclosed herein provides improved and more effective protection of the solder joint connection of the chip to the substrate. "Liquid Metal Cooled Integrated Circuit Module Structures" by E. Berndlmaier, B. T. Clark and J. A. Dorler, IBM Technical Disclosure Bulletin, Vol. 20, No. 11B, April 1978, pages 4817-8. This publication in the IBM Technical Disclosure Bulletin is authored by the applicants' of the subject application. The liquid metal cooled integrated circuit module structure disclosed in the publication of April 1978, substantially corresponds to the structure shown as an illustrative embodiment of applicants' invention hereinafter.

OBJECTS AND SUMMARY OF THE INVENTION

The primary object of the invention is to provide an improved heat transfer structure for an integrated circuit chip package.

A principal of the object of the invention is to provide an improved heat transfer structure for an integrated circuit flip-chip package which overcomes the afore-recited disadvantages of the prior art and specifically provides improved protection against contamination of the chip connections.

A more specific object of the invention is to provide an improved conformal liquid metal heat transfer structure for an integrated circuit chip package which presents a low thermal resistance, while still maintaining a high electrical resistance to the integrated circuit device where required. The addition of the protective film may be masked to provide selected isolation between chip and thermal conduction medium.

Still another object of the invention is to provide an improved liquid metal heat transfer structure for an integrated circuit flip-chip package which overcomes the heat transfer gate provided by the solder bumps in the flip-flop device, and additionally protects the solder bumps from contamination by the liquid metal. The heat transfer structure includes the entire chip surface area.

An additional object of the invention is to provide an improved liquid metal heat transfer structure for an integrated circuit package which does not adversely affect the reworkability of the package.

Still another object of the invention is to provide an improved liquid metal heat transfer structure for an integrated circuit flip-chip package which is both economical and reliable.

A still further object of the invention is to provide an improved liquid metal heat transfer structure for an integrated circuit flip chip package which minimizes the stresses placed on the integrated circuit device and in particular, on the flip-chip connections of the chip to the substrate.

A yet further object of the present invention is to provide an improved liquid metal heat transfer structure for an integrated circuit flip-chip package which is simple in construction relatively readily fabricated and specifically provides contamination protection for the solder joints or flip-chip connections of the chip to the substrate.

The foregoing and other objects and advantages are accomplished according to the invention wherein a thermal liquid material is contained in a cavity on the inside of the cover adapted to enclose the integrated circuit flip-chip package, or back bonded chip package. The major heat removal path from the large scale integrated circuit semiconductor chip is via the thermally conductive liquid. The integrated circuit chips are flip-chip, or beam lead bonded to a substrate having a circuit pattern and raised contact pads serving to interconnect contact areas on the chip. A preferably metal cover engages the perimeter of the substrate and encloses the chip (or chips). The thermal liquid is contained within the cavity defined by the cover and the substrate. The chip (or chips) and the flip-chip connections or beam leads are protected from the deleterious effects of the thermally conductive liquid by a parylene film, or the equivalent, enveloping same. This permits various chip heights and thicknesses and/or components to be conformally contacted from chip to external heat sink or surface.

Other objects of the invention will be pointed out in the following description and claims and illustrated in the accompanying drawings, which disclose by way of example the principal of the invention and the best modes which have been contemplated of applying that principal.

Figure 1:
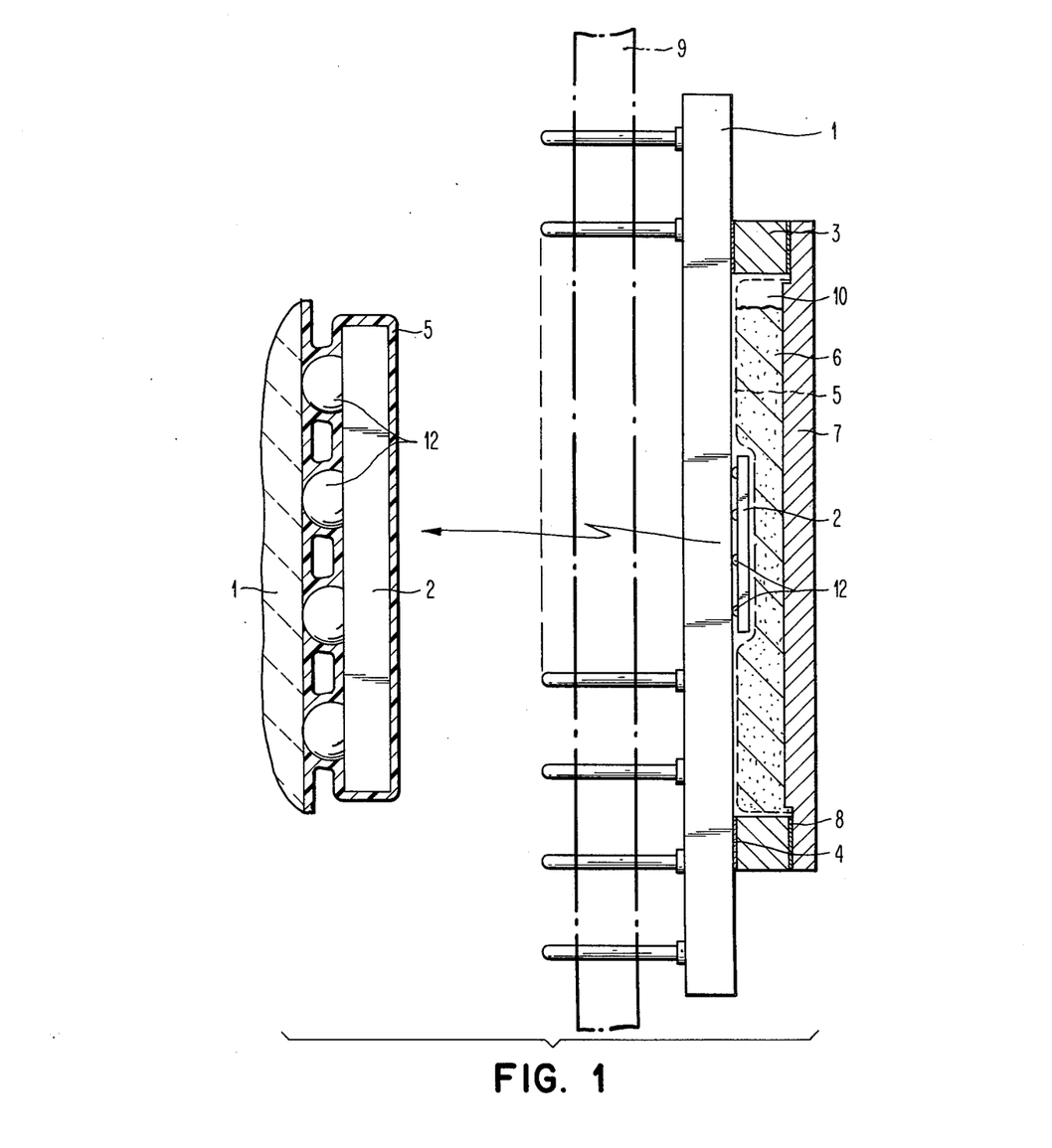
FIG. 1 shows a cross sectional view of a single chip module mounted on next level package. Parylene or equivalent protective coating isolates chip from liquid metal.
Figure 2:
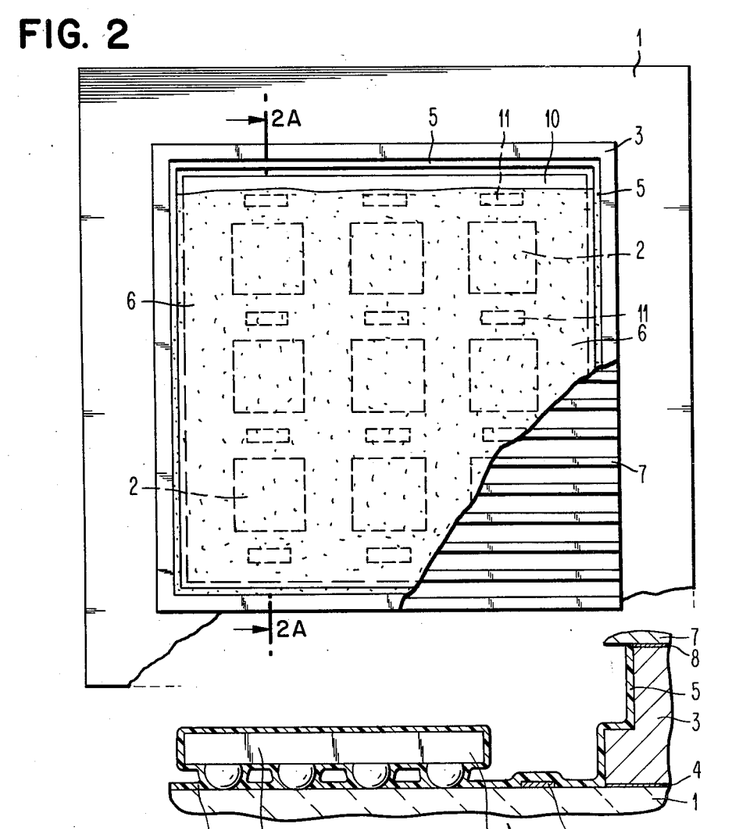
FIG. 2 shows the top view of a multichip module with chip and engineering change network pads being insulated from liquid metal. Engineering change connection leads would also be insulated from the liquid metal in similar fashion.
Figure 2A:
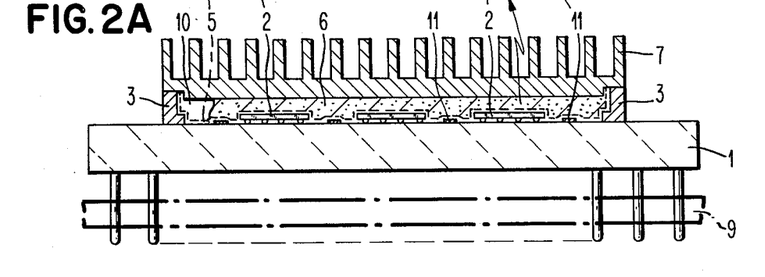
FIG. 2A shows the cross sectional view of the multichip module.

The structure shown in FIGS. 1 and 2 represent a means for obtaining efficient heat transfer from a source of heat generation (an integrated circuit chip) through the interior of a surrounding enclosure and into the confining walls of the enclosure (lid, frame and substrate base). A substrate 1 supporting chip 2 (or chips) is fitted with a frame 3 by bonding along seam 4. A continuous (unbroken) conformal coating 5 is then applied over the entire interior of the compartment bonded by the frame to afford both physical and electrical isolation. Specifically, the conformal coating fully encompasses and coats all sides of the chip and each of the flip-chip connections. The coated compartment is then filled with a suitable medium 6 (a liquid metal such as 75/25 gallium indium) for heat transfer in a volume sufficient to approach capacity when enclosed without causing overflow. The structure or module is completed by the seating of a lid 7 secured to the frame by seal 8.

In operation, the module (plugged into a printed circuit card 9 or other receptacle) is oriented on end (as shown) causing any air gap 10 (resulting from filling to slightly under capacity) to be situated along one wall of the frame 3, leaving an uninterrupted path for thermal conduction directly from the coated back and side surfaces of the chip 2 through the medium 6 to the inside surface of the lid 7. The medium 6 surrounding the chip 2 also promotes the efficiency of conduction to secondary avenues of escape through the surrounding substrate body 1 and submerged wall of the frame 3.

Structural organization is important for effective function with this arrangement. Given a substrate 1 of alumina ceramic printed with surface metallurgy 11 and joined with a chip 2 (or chips) of silicon by solder columns (or connections) 12, the need for preserving electrical isolation and providing environmental protection is apparent. This need is satisfied after seating of the frame 3 by deposition of a conformal coating 5 consisting of a material such as parylene, whose penetration and continuity of coverage are controllable in films thin enough to afford protection without substituting a significant layer of thermal insulation. As shown in the drawing, this conformal coating fully encompasses all sides of chip 2 and the solder connections 12. The coating 5, by extending to cover the inside walls of the frame 3, also creates a two directional supplementary seal along seam 4 or the walls of the frame 3. This permits considerable latitude in the selection of materials and or techniques to be used for fabrication of the frame 3 and seam 4.

To promote efficient heat transfer the frame 3 as well as the lid 7 are constructed of material with the most suitable thermal conductivity consistent with physical/chemical durability and manufacturability. To minimize stresses on the final seal 8, the material of frame 3 and lid 7 are also matched to one another. Nickel plated brass exemplifies a potential material compromise to be considered for fabrication of the frame 3 and lid 7. The seam 4 between the substrate 1 and the frame 3 is provided in a manner capable of compensating for differences, (should they exist) between the thermal expansivities of the substrate 1 and the frame 3. Certain epoxies, (such as SCOTCHCAST) thermal plastic organics or ductile metals associated with printed metallic seal bands are capable of affecting a satisfactory seam 4. Materials such as eutectic solder, or silver conductive epoxy may be employed.

The internal medium 6, or filler, consists of a material with efficient heat transfer characteristics which will displace to conform with the interior contours of the enclosure upon seating of the lid 7. Since a slight volumetric allowance is made between the capacity of the enclosure and the amount of the material implanted to avoid transmitting force against the chip 2 hydraulically, the medium 6 must also have tendency to seek its own level to assure its flow upon orienting the module on edge to provide intimate contact with the coated surfaces of each chip 2. Intimate contact with the inside surfaces of the lid 7, and a direct path between the two.

While a number of materials including powers, liquids, greases and gels, might perform satisfactory liquid metals combine excellent thermal conductivity and conformal flow characteristics.

The final sealing utilizes the steps contour of the interior surface of the lid 7 to progressively displace and distribute the medium 6 within the finished enclosure as the lid 7 is lowered. As the mating surfaces of the lid 7 in frame 3 are brought into contact with one another, the seal 8 consisting of an organic or metallic band which cures or reflows at low temperature joins the lid 7 and the frame 3 along their mating surfaces, completing the structure. The following significant feature of the invention is to be fully appreciated. Construction of a liquid metal filled module requires the application of a conformal coating to all interior module surfaces which are not inherently impervious to chemical reaction or electrical shorting with the thermal medium. The most effective method of achieving continuous coverage is by vapor deposition of a material such as parylene. Additionally, chip and/or components of varying thicknesses can be placed on the substrate and still maintain a very efficient heat transfer path from chip to substrate lid.

FIGS. 3 through 6 respectively depict (in cross section) portions of a circuit module having a substrate, a semiconductor chip (or chips) connected by solder (C-4) connections to lands, (not shown) on the substrate. As further illustrated only in FIG. 3 each of the module substrates carries a number of pins, at least certain of which are connected via C-4 connections to the integrated circuitry on the chip.

In each of the structures shown, a liquid metal is employed to provide an efficient thermal pad from a conformally contacted planar surface of the chip (chips) to the metal module cap. Suitable liquid metals are mercury, gallium, indium, and so forth and alloys thereof. Each of the structures provides an excellent heat transfer path from a semiconductor chip to ambient air.

Figure 3:
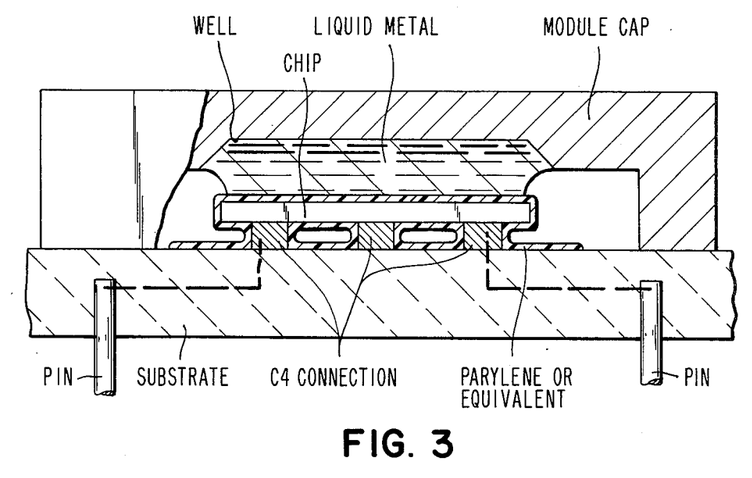
FIG. 3 shows the cross sectional view of a single chip module indicating the protective coating of parylene, or equivalent, on the chip and C-4 connections.

In FIG. 3 is shown the embodiment of confining the liquid metal to the backside of the chip. The thermal medium is retained in place between the chip and module cap by surface tension. The volume of liquid metal is placed in the module cap well and the chip mounted on substrate is brought into contact with the module cap.

Figure 4:
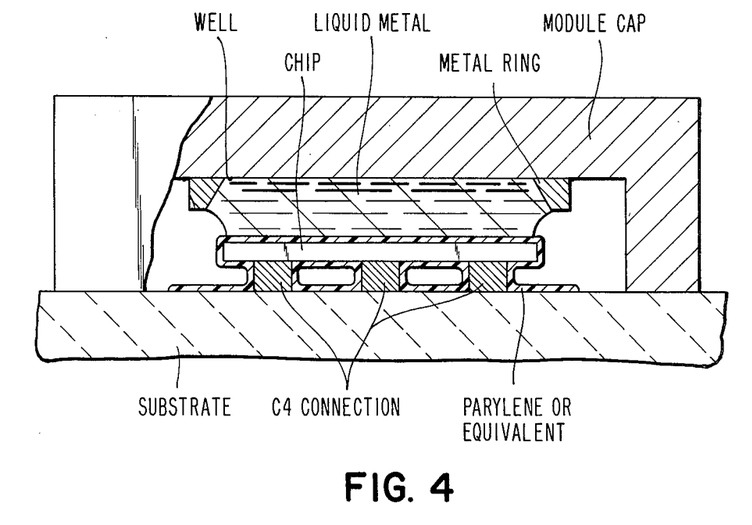
FIG. 4 shows the cross section of a single chip module with a protective coating of parylene or equivalent on the chip and C-4 connections.

FIG. 4 shows a well formed by the placement of a metal ring to the module cap. Again, liquid metal is retained in place by the materials surface tension.

In both FIGS. 3 and 4, the chip and C-4 connections have a protective coating of parylene, or equivalent.

Figure 5:
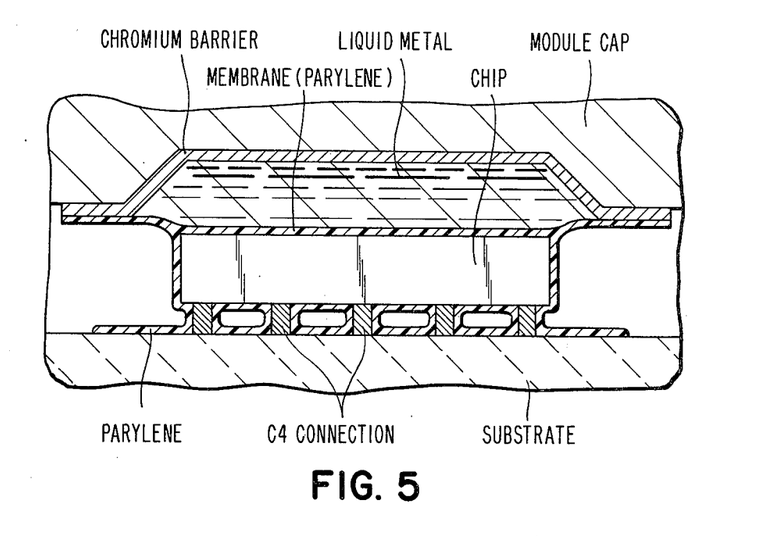
FIG. 5 shows the cross section of single chip module with protective coating of parylene, or equivalent, on the chip and C-4 connections.

FIG. 5 shows the liquid metal being contained within a membrane of which parylene or equivalent is a suitable material. Furthermore, the chips and C-4 connections have a protective coating of parylene or equivalent.

Figure 6:
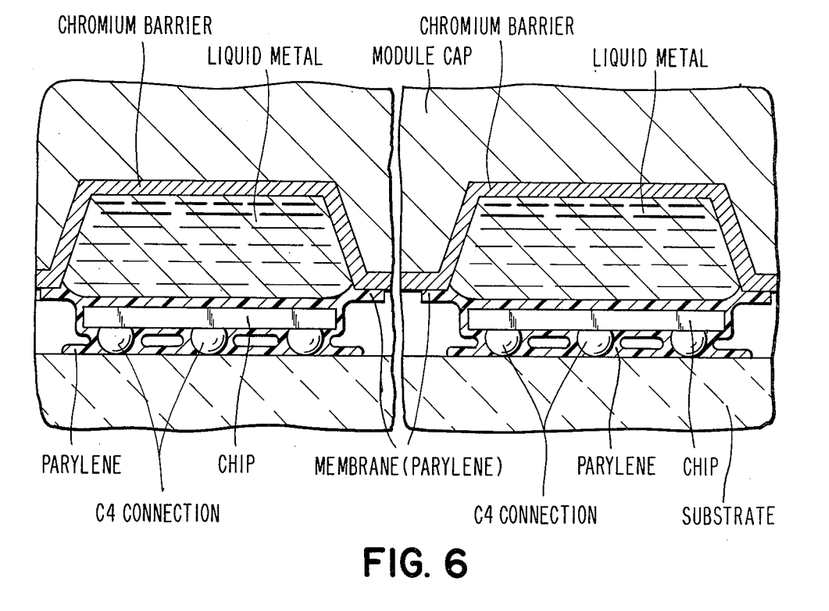
FIG. 6 shows the cross section view of a multichip module using parylene for both the protective coating of chip and C-4 connections as well as the liquid metal containment membrane.

FIG. 6 illustrates a multichip module with each chip site having the liquid metal retained by a parylene or equivalent membrane. Again, the chip and C-4 connection have a protective coating of parylene.

Figure 7:
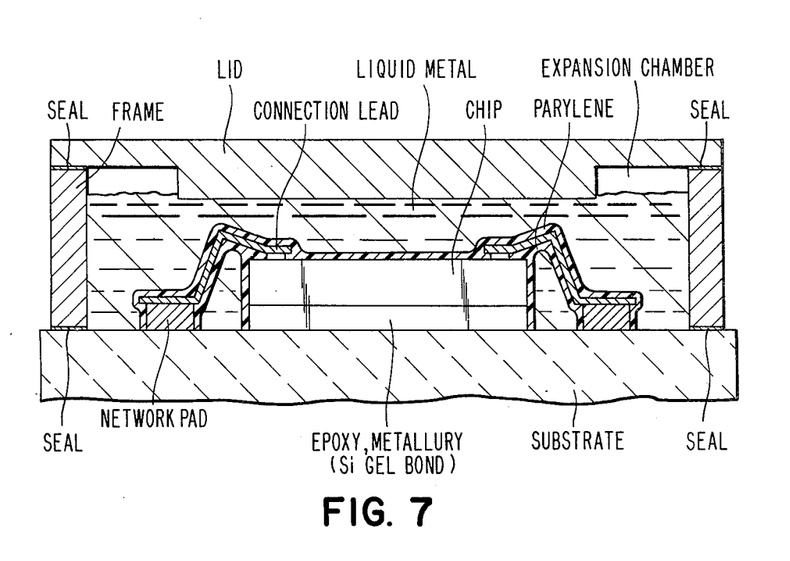
FIG. 7 shows the cross sectional view of a chip backside, or beam lead, bonded to the module substrate. The network pads, connection leads and chip have a protective coating of parylene, or equivalent. Liquid metal provides a conformal thermal path between chip and module lid.

The feature of this invention is also applicable to a chip which is backside bonded. This is shown in FIG. 7. The chip is mounted to the substrate by means of an epoxy, metallurgy, gel bond or equivalent. Connection leads are made between chip and network pads in the normal fashion. A protective coating of parylene or equivalent is deposited to isolate the chip and connections from the liquid metal.

Figure 8:
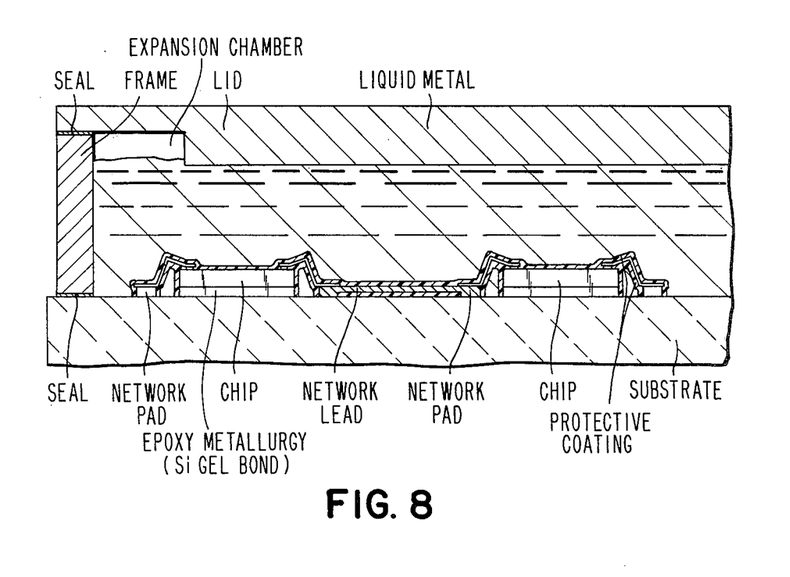
FIG. 8 shows the cross section of a multichip module wherein the chips are backside or beam lead bonded and protected from the heat conduction medium by parylene, or equivalent.

This can be extended to a multichip module and is illustrated in FIG. 8. Again the chip, network pads as well as the network leads have a protective coating of parylene or equivalent.

FIG. 6 discloses a multichip embodiment. The structure of FIGS. 3, 4 and 5 may readily be extended to accommodate a number of integrated circuit chips within one module.

While there have been shown and described and pointed out the fundamental novel features of the invention as applied to preferred embodiments, it will be understood that various omissions and substitutions and changes in the form and details of the device illustrated in its operation may be made by those skilled in the art without departing from the spirit of the invention. It is the intension, therefore, to be limited only as indicated by the following claims.

Having thus described my invention, what I claim as new, and desire to secure by Letters Patent is:

1. In an integrated circuit assembly including:
   at least one semiconductor chip on a circuitized substrate with a cover mounted on said substrate to enclose said semiconductor chip;
   said chip and said circuitized substrate being electrically connected one to the other by a plurality of discrete solder connections;
   a formable electrically insulative film in physical contact with said chip and enclosing a thermally conductive material between said film and the underside of said cover, said formable electrically insulative film is a non-conductive protective film of vapor deposited parylene, said thermally conductive material enclosed between said film of vapor deposited parylene and the underside of said cover is a liquid metal and said liquid metal includes at least one selected from the group of Gallium, Indium and mercury,
   said assembly being characterized by the provision of said non-conductive vapor deposited parylene protective film encompassing each of said solder connections.

2. In an integrated circuit package including:
   at least one semiconductor chip on a circuitized substrate with a cover mounted on said substrate to enclose said semiconductor chip;
   said chip and said circuitized substrate being electrically connected by beam lead connections;
   a thin formable electrically insulative film in physical contact with said chip and enclosing a thermally conductive material between said film and the underside of said cover, said thin formable electrically insulative film is a non-conductive protective film of vapor deposited parylene, said thermally conductive material enclosed between said film of vapor deposited parylene and the underside of said cover is a liquid metal and said liquid metal includes at least one selected from the group of Gallium, Indium and Mercury;
   said assembly being characterized by the provision of said protective film of vapor deposited parylene on each of said beam lead connections, whereby said chip and said beam lead connections are protected from the deleterious effects of said thermally conductive material.

3. An integrated circuit package, said package including: a substrate containing a circuit pattern and a plurality of connection pads contained on a planar surface of said substrate;

an integrated circuit chip and a plurality of connection pads contained on a planar surface of said chip;

connections means selectively interconnecting said pads on chip with said pads on said substrate;

a cover enclosing said planar surface of said substrate and said chip;

a conformal thermally conductive material positioned between said cover and said chip and an inert protective film of vapor deposited parylene in physical contact with said chip and enclosing said thermally conductive material between said vapor deposited parylene film and the underside of said cover, said conformal thermally conductive material includes at least one liquid metal selected from the group of Gallium, Indium and Mercury;

said packaging structure being characterized by the inclusion of said inert protective film of vapor deposited parylene completely encompassing at least said chip, said connection means, and said connection pads, whereby said conformal thermally conductive material provides an efficient heat removal path from said chip to said cover and said inert protective film of vapor deposited parylene completely protects said chip, said connections means and said connection pads from the deleterious effects of said thermally conductive material.

* * * * *